(12) United States Patent
Kaluzhny et al.

(10) Patent No.: US 7,326,915 B2
(45) Date of Patent: Feb. 5, 2008

(54) WAVELENGTH STABILIZATION FOR BROADBAND LIGHT SOURCES

(75) Inventors: Mikhail Kaluzhny, Newton, MA (US); Alex Rosiewicz, Stow, MA (US)

(73) Assignee: EM4, Inc., Bedford, MA (US)

( * ) Notice: Subject to any disclaimer, the term of this patent is extended or adjusted under 35 U.S.C. 154(b) by 19 days.

(21) Appl. No.: 11/097,786

(22) Filed: Apr. 1, 2005

(65) Prior Publication Data

US 2006/0219877 A1    Oct. 5, 2006

(51) Int. Cl.
*H01J 5/16* (2006.01)
*H01J 3/14* (2006.01)
*G02F 1/33* (2006.01)
*G01N 21/25* (2006.01)
*H04N 5/225* (2006.01)

(52) U.S. Cl. ............... 250/226; 250/205; 250/216; 359/307; 359/308; 356/416; 356/419; 348/342

(58) Field of Classification Search ........... 250/226, 250/214, 205, 227.14, 214.1, 216, 227.18, 250/227.23; 359/110, 187, 260, 307, 308; 385/12, 13, 15, 37; 356/320, 416

See application file for complete search history.

(56) References Cited

U.S. PATENT DOCUMENTS 6,144,025 A    11/2000  Tei et al.
6,744,793 B2 *  6/2004  Stoner et al. ............... 372/32
6,933,485 B2 *  8/2005  Livermore et al. ......... 250/205
7,119,324 B2 * 10/2006  Voigt ...................... 250/227.14
2004/0094698 A1 *  5/2004  Imaki et al. ................ 250/225
2005/0231728 A1 * 10/2005  Wang et al. ................ 356/480

OTHER PUBLICATIONS

Schuma, R.F., Killian, K. M., *Superluminescent diode (SLD) wavelength control in high performance fiber optic gyroscopes*, SPIE vol. 719 Fiber Optic Gyros: 10th Anniversary Conference, 1986.
Chou, H., Ezekiel, S., *Wavelength stabilization of broadband semiconductor light sources*, Optical Society of America, 1985.
*Light-Emitting Diodes*, Electrical Engineering Training Series.

* cited by examiner

*Primary Examiner*—Georgia Epps
*Assistant Examiner*—Don Williams
(74) *Attorney, Agent, or Firm*—Wilmer, Cutler, Pickering, Hale and Dorr LLP

(57) ABSTRACT

A broadband light source, such as a light-emitting diode (LED), such as a superluminescent light-emitting diode (SLED), has its mean wavelength stabilized by using a filter to pass a characteristic of the output of the source, detecting the filtered output, and adjusting a parameter affecting the wavelength of the source, such as drive current or temperature. A Gaussian or near-Gaussian filter can be used to obtain an intensity detection, or two narrowband filters can be used where one filter passes a wavelength greater, and one passes a wavelength less, than the desired mean wavelength.

23 Claims, 6 Drawing Sheets

WAVELENGTH STABILIZATION FOR BROADBAND LIGHT SOURCES

BACKGROUND

This application relates to broadband light sources, such as superluminescent light-emitting diodes (SLEDs).

A SLED is a type of LED that has stimulated emission with amplification, but with insufficient feedback for lasing. A SLED can be used with some applications where it is desirable to have incoherent light and a broader optical bandwidth. As used here, a broadband light source means a source with a bandwidth of 10 nm or more at full width half maximum (FWHM).

SUMMARY

Systems and methods are described for stabilizing the mean wavelength of a broadband light source, such as a light-emitting diode (LED), including a superluminescent light-emitting diode (SLED). A filter is used to pass the output of the light source, a filtered output is detected, and a parameter affecting the mean wavelength of the light source is adjusted to get the mean wavelength to a desired value. In one embodiment, the filter includes a Gaussian filter and the detector detects an intensity of the output. Based on changes in the intensity, a control to the light source is altered to get the wavelength back to a desired value. In another embodiment, two narrowband filters are used where one passes a wavelength that is greater, and one passes a wavelength that is less, than the desired mean wavelength. Changes are detected, and controls are altered to adjust the mean wavelength to a desired value. Methods for changing the mean wavelength include adjusting a drive current or a temperature control.

Other features and advantages will become apparent from the following detailed description, drawings, and claims.

DETAILED DESCRIPTION

This application describes systems and methods for stabilizing the wavelength of broadband light sources. The application is described particularly in the context of superluminescent light emitting diodes (SLED), but it should be understood that other broadband sources could use the same or similar systems and methods.

Figure 1:
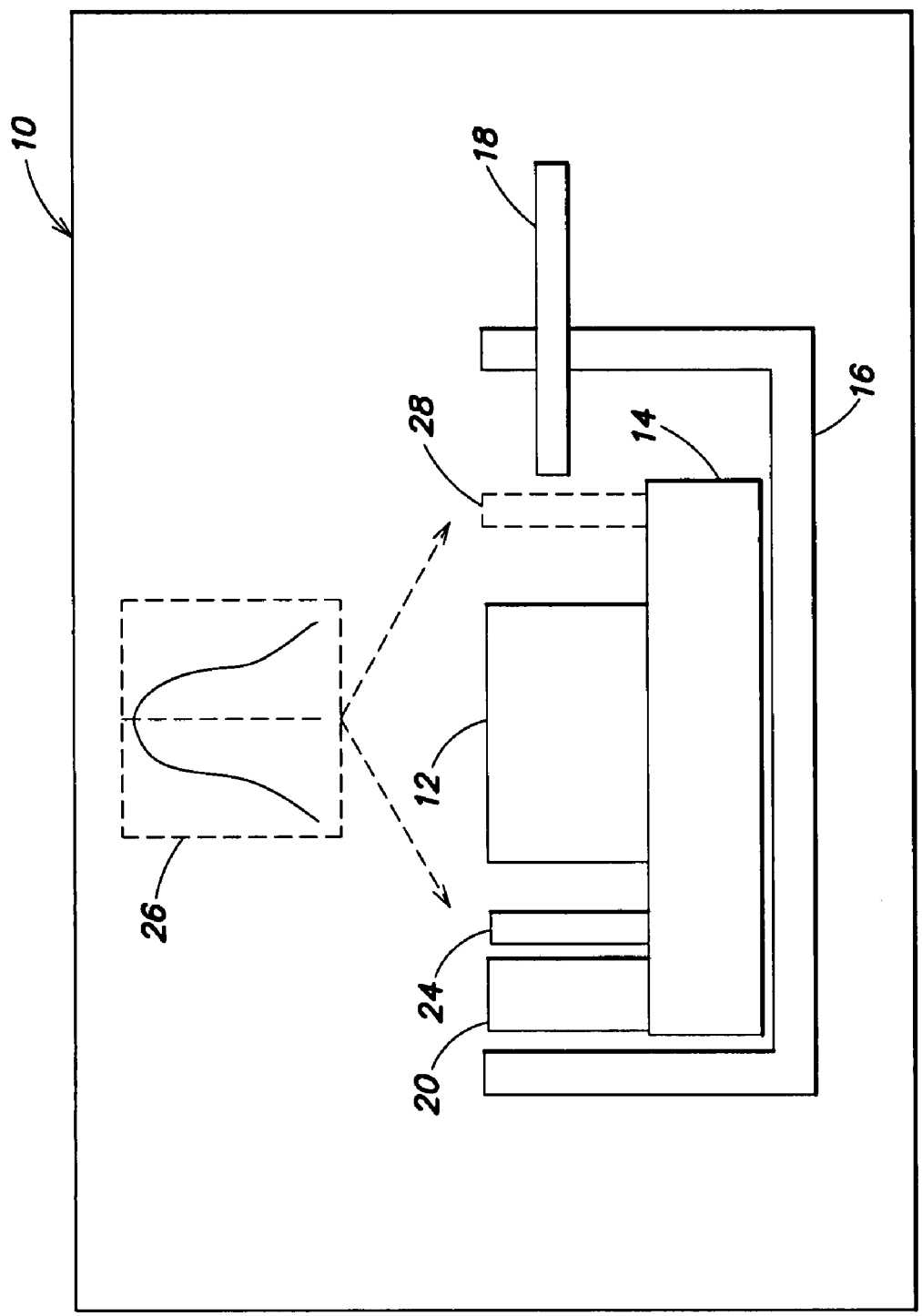
FIGS. 1 and 2 are block diagrams illustrating side and plan views of an embodiment of a wavelength stabilizing system.
Figure 2:
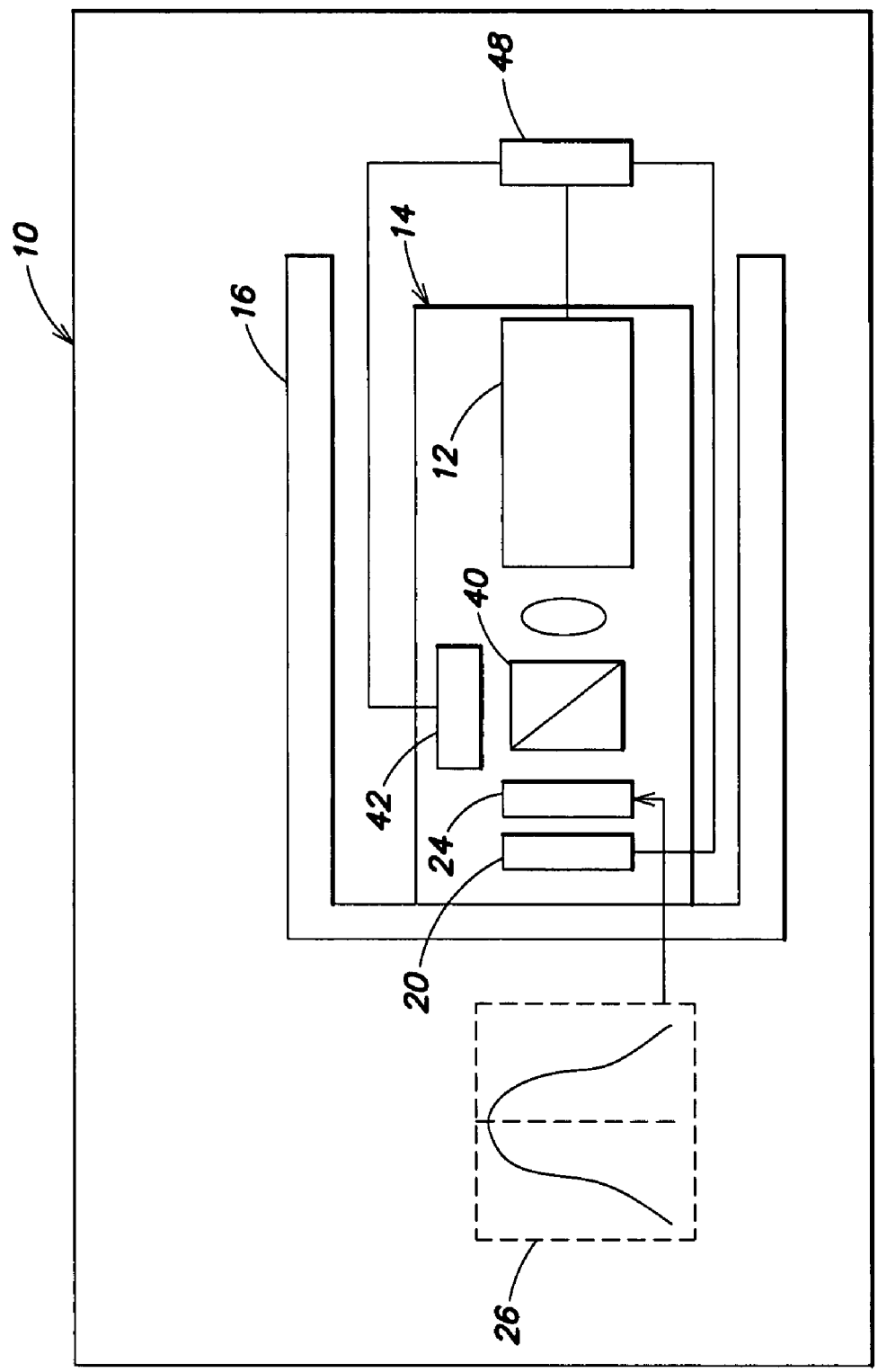

Referring to FIGS. 1 and 2, in a typical SLED packaging system 10, a SLED chip 12 is mounted on top of a thermoelectric cooler (TEC) 14 and enclosed in a housing 16. SLED chip 12 can emit light at a front surface to an optical fiber 18, and can also emit light at a rear surface to a power monitoring photodetector 20. In this embodiment, the system requires only intensity monitoring of a SLED to maintain mean wavelength stability. A wideband filter 24, preferably with a Gaussian or close to Gaussian spectral distribution (as shown at 26) is placed between SLED chip 12 and photodetector 20. The intensity signal on detector 20 is a convolution of the SLED output and the spectral distributions of filter 24. Filter 24 could be a stand alone filter or it could be a thin film filter deposited directly on detector 20.

Figure 3:
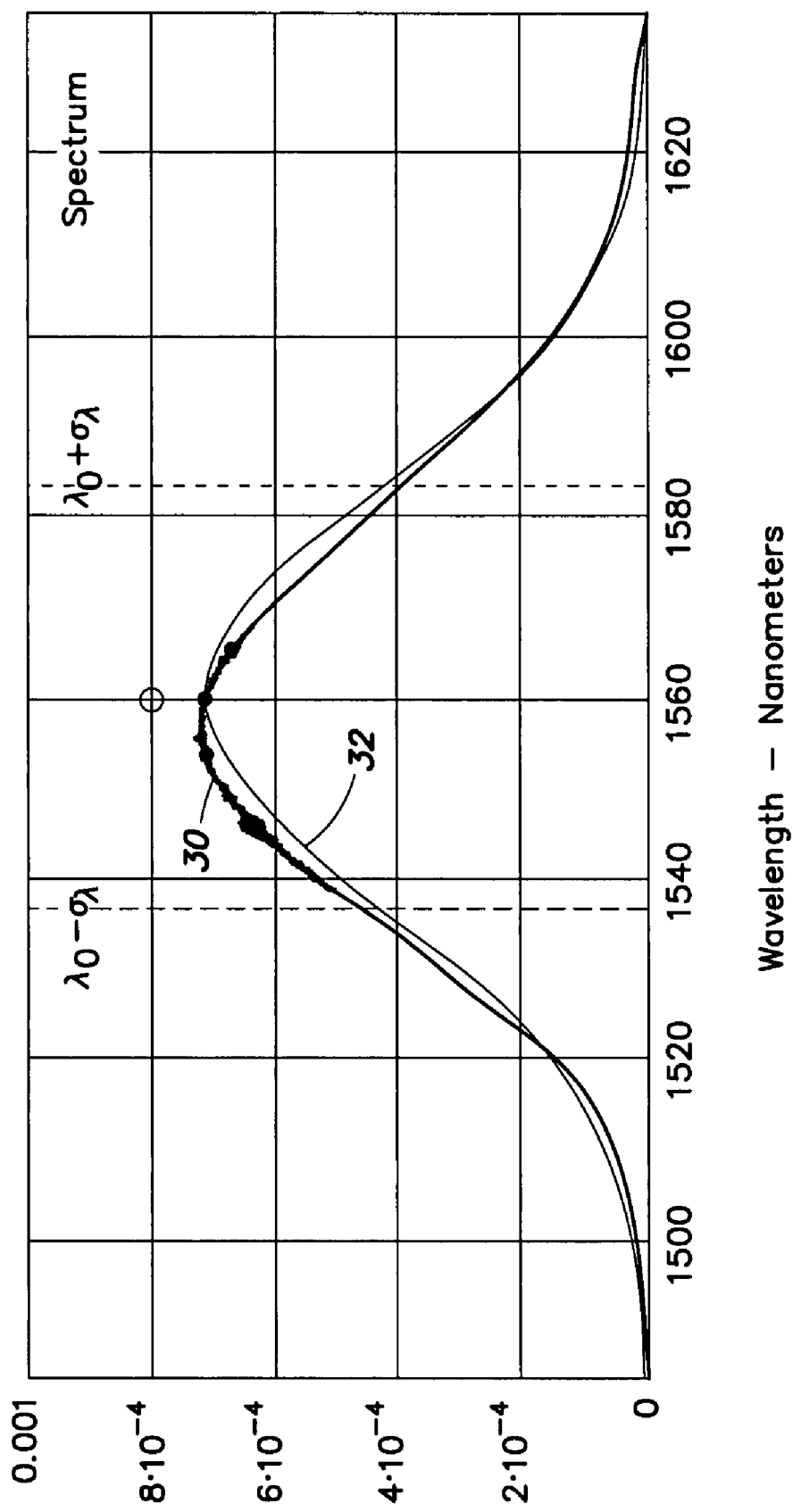
FIG. 3 shows a SLED spectral distribution and a Gaussian filter profile for use with the embodiments of FIGS. 1 and 2.

Referring also to FIG. 3, the graphs show an example of a spectral distribution 30 of a SLED, and a Gaussian spectral distribution 32. As shown in this example, the spectral distributions are similar. The peak of the intensity of the SLED is at about 1550 nm, and the spectral width of the SLED at one-half the peak intensity is about 50 nm.

If the SLED's mean wavelength changes over time, the detected intensity signal will change as well. In the example of FIG. 3, the peak of the filter is greater than the peak of the SLED, so as the mean wavelength of the SLED increases, the detected intensity will increase, and if the mean wavelength of the SLED decreases, the detected intensity will decrease. A signal from photodetector 20 is provided to control circuitry 48 (see FIG. 2) that adjusts a parameter that controls the mean wavelength of the SLED. This parameter can be, for example, a drive current to the SLED or a temperature setting of the TEC. The filter's spectrum need not be perfectly Gaussian, and it could be a conventional filter, a distributed Bragg reflector (DBR) filter, or any other suitable design. The control system can control the mean wavelength every time there is a deviation or a deviation outside a threshold, or it could be responsive to other parameters for when to adjust the mean wavelength.

If the filter spectral distribution is close to an ideal Gaussian in comparison with the SLED, an additional filter 28 can be placed between SLED chip 12 and fiber 18 to improve the SLED's spectral distribution and to improve the coherence function.

Referring to FIG. 2, in addition to the mean wavelength changing, the SLED's power could also change over time. A beam splitter 40 can be provided at the rear of SLED chip 12 for splitting the beam, preferably equally, to filter 24 and detector 20, as also shown in FIG. 1, and additionally to a second detector 42 that is used as a power reference. In this case, a constant ratio is maintained between the two detectors to keep the mean wavelength stable.

As also shown more explicitly in FIG. 2, detector 20 and detector 42 (if used) are coupled to a control system 48 for being responsive to signals from the detectors, and for providing signals to other components, such as controlling the temperature to TEC 14 and/or controlling a drive current to SLED chip 12. The control system thus serves as a feedback loop to maintain a desired mean wavelength for the SLED. Control system 48 can include discrete or integrated circuitry, and/or can include general or specific-purpose programmable logic, such as an application-specific integrated circuit (ASIC) or general purpose computer hardware and software.

Figure 4:
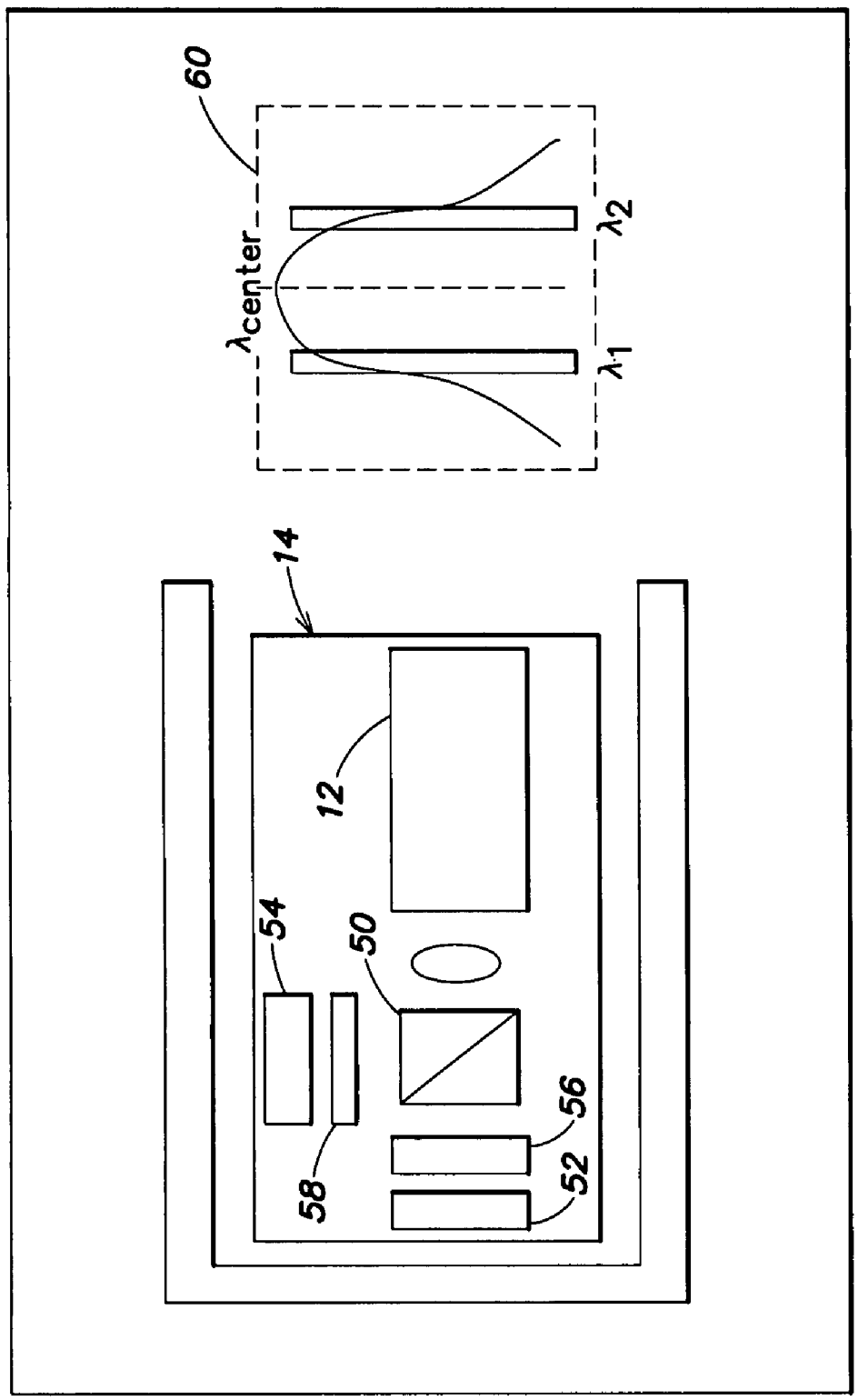
FIG. 4 is a block diagram of an embodiment using two narrowband filters.

FIG. 4 shows another embodiment of how to stabilize the wavelength of a SLED. In this embodiment, a beam from a back facet of SLED chip 12 is split in two beams (e.g., 50/50) using a non-polarizing beam splitter 50. The two resulting beams are provided to respective photodetectors 52, 54 through narrowband filters 56, 58 with different wavelengths $\lambda_1$ and $\lambda_2$, respectively. Filters 56, 58 are preferably symmetrical relative to the SLED mean wavelength $\lambda_{mean}$ as shown at 60, although exact symmetry is not required.

The embodiment of FIG. 4 can utilize a control system similar to that shown in FIG. 2. As the mean wavelength deviates from the desired wavelength, the intensity detected by one detector will increase and the intensity detected by the other will decrease, thereby indicating the magnitude and the direction of the change in the mean wavelength.

Referring to FIG. 3, an example is shown with wavelengths that can be used on either side of a mean wavelength. In this example, the wavelengths are at greater than one-half the peak intensity, and about ⅔ of the peak intensity.

For a reasonable range of SLED mean wavelength variations, the detector signals can be balanced using, for example, trim resistors. A differential amplifier can be used to maintain the detector signals equal to each other using either SLED current or temperature control. This approach can be substantially insensitive to power degradation if the change in intensity versus the change in wavelength (dI/dλ) is not great at the filter wavelength because the power at each detector should reduce about equally (i.e., a common mode input).

Figure 5:
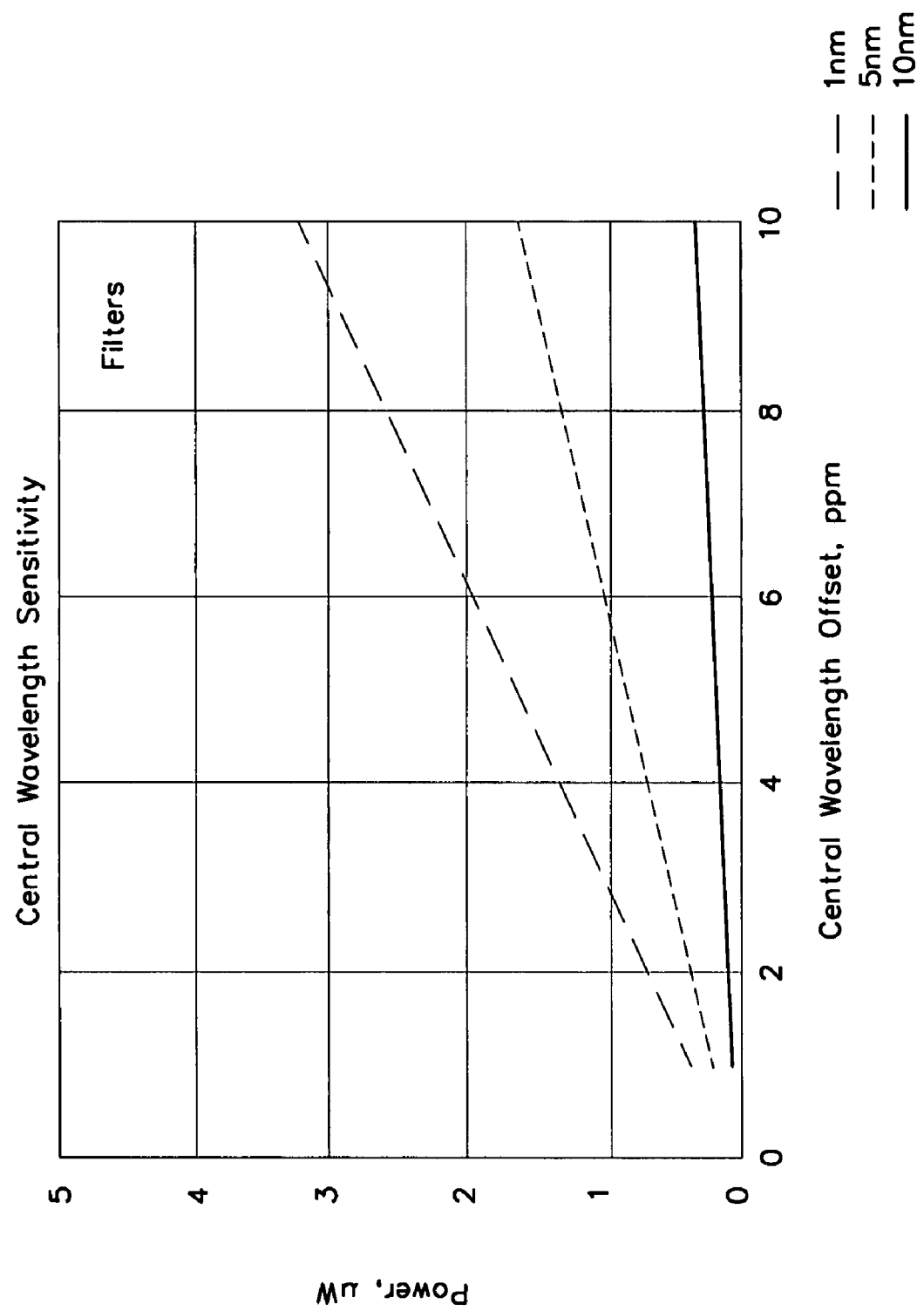
FIG. 5 is a graph showing an estimate of mean wavelength offset in parts per million (ppm).

Referring to FIG. 5, an estimate is made assuming ideal Gaussian distribution and different filter spectral widths of 1, 5, and 10 nm. The graph shows that better than 10 ppm wavelength stability could be achieved for detectors with signal difference of 1 µW, which is within the capability of conventional electronics.

Figure 6:
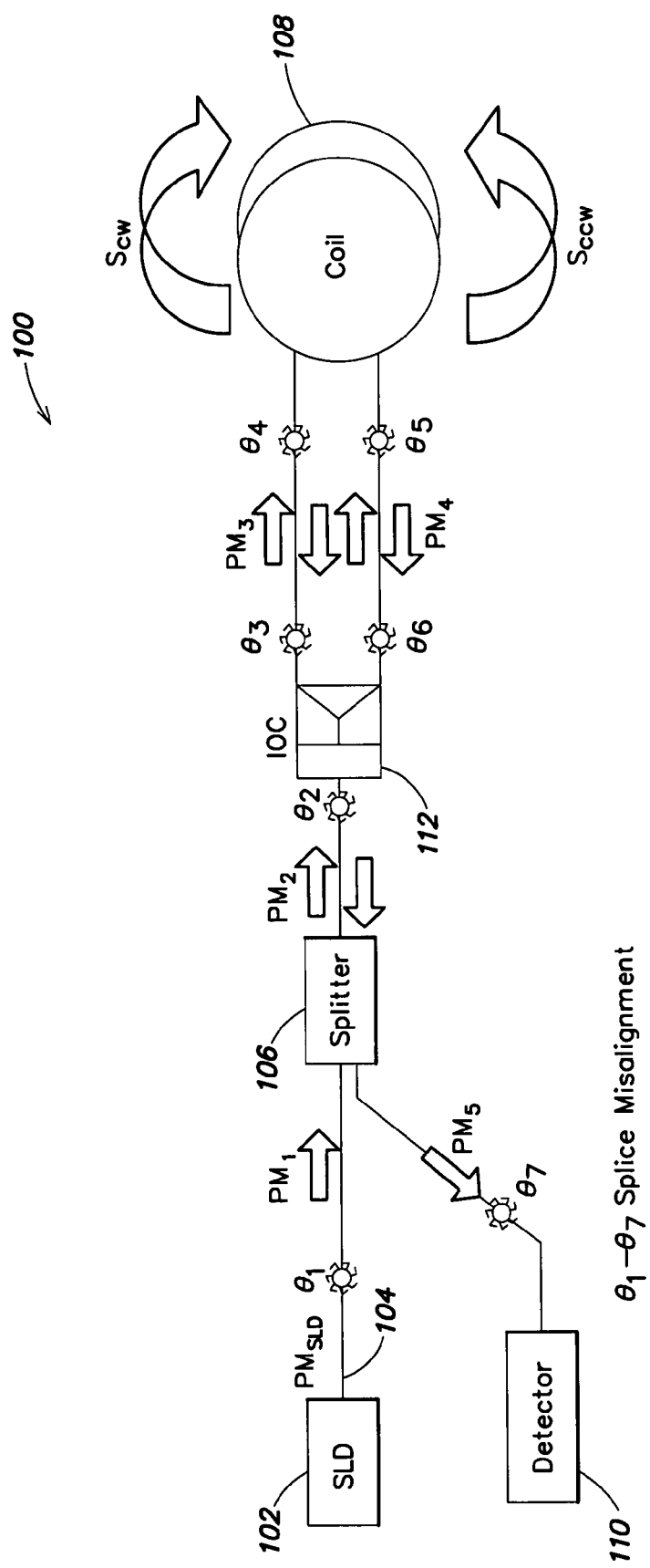
FIG. 6 is a diagram of a fiber optic gyroscope (FOG) with a SLED in packaging as shown in FIG. 1 or 4.

Wavelength-stabilized SLEDs can be used in different applications. One example is its use in a navigation grade fiber optics gyroscope (FOG), an example of which is shown in FIG. 6. The components, with the exception of the coil, are commonly referred as "the front end." While different components could be used, a typical front end of a FOG 100 includes a broadband light source 102 (such as a SLED), a splitter 106, an integrated optical modulator (IOC) 112, and a detector 110. In FOG 100, source 102 (such as a SLED) provides a light beam 104 that is split with IOC 112 into two beams, each provided at an opposite end of a fiber optic coil 108. Coil 108 can be on the order of hundreds of meters long. A detector 110 receives the beam out of each end of the fiber after it has traveled through coil 108, and a difference in phase of the detected light is used to determine whether the coil has been rotated about a central axis. The difference in phase is sometimes referred to as the Sagnac effect.

A broadband light source with close to Gaussian spectral distribution, coherence length less than 0.1 mm, and mean wavelength stability over lifetime below 50 ppm is desirable for high performance FOGs. Typically SLEDs have reasonable spectral characteristics, and low coherence length; but the mean wavelength can move 500-1000 ppm (0.05-0.1%) over lifetime. By using the wavelength stabilization systems and methods described here, the change in the mean wavelength could be reduced to a much lower number of ppm, and preferably 50 ppm (0.005%) or less.

While certain embodiments have been shown and described, other embodiments are within the following claims. For example, additional optical components could be provided between various components, such as additional filters. While a FOG has been shown explicitly, the SLED could be used for other applications, such as other sensing and measuring applications.

What is claimed:

1. An apparatus comprising:
    a broadband light source for emitting light with a source mean wavelength;
    a filter with a generally Gaussian spectral distribution for receiving light from the source for filtering the light to provide filtered light, the filter having a filter mean wavelength, the filter for filtering substantially all the light from the light source when the filter mean wavelength is substantially equal to the source mean wavelength;
    a first detector for detecting the filtered light and for providing a signal indicative of a parameter of the filtered light; and
    a control system responsive to the signal from the detector for controlling the mean wavelength of the light emitted from the source if the mean wavelength deviates from a desired value.

2. The apparatus of claim 1, wherein the filter is spaced from the detector and housed in a separate component.

3. The apparatus of claim 1, wherein the filter is formed on a surface of the detector.

4. The apparatus of claim 1, wherein the source includes a light emitting diode (LED).

5. The apparatus of claim 1, wherein the source includes a superluminescent light emitting diode (SLED).

6. The apparatus of claim 1, wherein the source is mounted to a thermo-electric cooler (TEC), the control system controlling the mean wavelength by controlling the temperature of the TEC.

7. The apparatus of claim 1, wherein the control system controls the mean wavelength by controlling a drive current to the source.

8. The apparatus of claim 1, further comprising a second detector, and a beam splitter between the source and the filter for providing a first beam to the first detector and a second beam to the second detector, the control system being responsive also to a signal from the second detector.

9. The apparatus of claim 1, further comprising an optical fiber for receiving light from the source.

10. The apparatus of claim 9, further comprising a generally Gaussian filter between the source and the optical fiber.

11. The apparatus of claim 1, further comprising a fiber optic gyroscope for receiving light from the source.

12. The apparatus of claim 11, wherein the source includes a light emitting diode (LED).

13. The apparatus of claim 11, wherein the source includes a superluminescent light emitting diode (SLED).

14. An apparatus comprising:
    a broadband light source for emitting light with a mean wavelength;
    a first narrowband filter for receiving light from the source and for passing light with a wavelength greater than the mean wavelength;
    a second filter receiving light from the source and for passing light with a wavelength less than the mean wavelength;
    a first detector for detecting light from the first filter and for providing a first signal;
    a second detector for detecting light from the second filter and for providing a second signal; and
    a control system responsive to the first and second signals and for controlling the mean wavelength of the light emitted from the source if the mean wavelength deviates from a desired value.

15. The apparatus of claim 14, wherein the source includes a light emitting diode (LED).

16. The apparatus of claim 14, wherein the source includes a superluminescent light emitting diode (SLED).

17. The apparatus of claim 14, further comprising a beam splitter for receiving a beam from the source and providing first and second beams to the first and second filters.

18. The apparatus of claim 14, wherein the source is mounted to a thermo-electric cooler (TEC), the control system controlling the mean wavelength by controlling the temperature of the TEC.

19. The apparatus of claim 14, wherein the control system controls the mean wavelength by controlling a drive current to the source.

20. The apparatus of claim 14, wherein each filter passes light with a wavelength where the intensity of the light from the source is about ⅔ of the peak intensity.

21. The apparatus of claim 14, further comprising a fiber optic gyroscope for receiving light from the source.

22. The apparatus of claim 21, wherein the source includes a light emitting diode (LED).

23. The apparatus of claim 21, wherein the source includes a superluminescent light emitting diode (SLED).

* * * * *